(12) United States Patent
Sawahata (10) Patent No.: US 12,518,670 B2
(45) Date of Patent: Jan. 6, 2026

(54) DISPLAY DEVICE

(71) Applicant: Sharp Display Technology Corporation, Kameyama (JP)

(72) Inventor: Junichi Sawahata, Kameyama (JP)

(73) Assignee: Sharp Display Technology Corporation, Kameyama (JP)

( * ) Notice: Subject to any disclaimer, the term of this patent is extended or adjusted under 35 U.S.C. 154(b) by 0 days.

(21) Appl. No.: 18/768,086

(22) Filed: Jul. 10, 2024

(65) Prior Publication Data

US 2025/0078719 A1   Mar. 6, 2025

(30) Foreign Application Priority Data

Aug. 29, 2023   (JP) .................................. 2023-139214

(51) Int. Cl.
*G09G 3/20* (2006.01)

(52) U.S. Cl.
CPC ... *G09G 3/2092* (2013.01); *G09G 2310/0267* (2013.01); *G09G 2310/0275* (2013.01); *G09G 2310/08* (2013.01); *G09G 2330/025* (2013.01)

(58) Field of Classification Search
CPC ......... G09G 3/2092; G09G 2310/0267; G09G 2310/0275; G09G 2310/08; G09G 2330/025; G09G 3/3677
See application file for complete search history.

(56) References Cited

U.S. PATENT DOCUMENTS

| 10,777,121 | B1* | 9/2020 | Liao | G09G 3/2092 |
| 2014/0016240 | A1* | 1/2014 | Kawata | H02H 3/0935 |
| | | | | 361/95 |
| 2018/0174501 | A1* | 6/2018 | Cao | H03K 17/687 |
| 2019/0080659 | A1* | 3/2019 | Zhang | H02H 1/0007 |
| 2019/0101777 | A1* | 4/2019 | Zhang | H03K 17/0812 |
| 2019/0122611 | A1* | 4/2019 | Nam | G09G 3/3258 |
| 2019/0197937 | A1* | 6/2019 | Lee | G09G 3/3677 |
| 2019/0251908 | A1* | 8/2019 | Kim | G09G 3/3275 |
| 2020/0212102 | A1* | 7/2020 | Park | H10K 59/878 |
| 2021/0375176 | A1* | 12/2021 | Shin | G09G 3/20 |
| 2022/0122503 | A1* | 4/2022 | Xiao | G09G 3/2003 |
| 2022/0345029 | A1* | 10/2022 | Choi | H02M 3/156 |
| 2022/0351658 | A1* | 11/2022 | Pan | H10D 86/441 |
| 2022/0415225 | A1* | 12/2022 | Yuan | G09G 5/18 |

(Continued)

FOREIGN PATENT DOCUMENTS

JP   2014-016577 A   1/2014

*Primary Examiner* — Jose R Soto Lopez
(74) *Attorney, Agent, or Firm* — ScienBiziP, P.C.

(57) ABSTRACT

A display device includes: a display panel including a pixel array including a plurality of pixels, a plurality of gate bus lines connected to the pixel array, a first gate driver circuit disposed on one side of the pixel array, and configured to supply a scan signal to the plurality of gate bus lines, and a second gate driver circuit disposed opposite the first gate driver circuit with respect to the pixel array, and configured to supply a scan signal to the plurality of gate bus lines; a first protection circuit configured to detect a first overcurrent supplied to the first gate driver circuit to protect the first gate driver circuit from the first overcurrent; and a second protection circuit different from the first protection circuit, and configured to detect a second overcurrent supplied to the second gate driver circuit to protect the second gate driver circuit from the second overcurrent.

15 Claims, 7 Drawing Sheets

(56) References Cited

U.S. PATENT DOCUMENTS

| | | | |
|---|---|---|---|
| 2023/0031812 A1* | 2/2023 | Zhu | G09G 3/2092 |
| 2023/0206836 A1* | 6/2023 | Shin | G09G 3/3233 |
| | | | 345/690 |
| 2024/0194161 A1* | 6/2024 | Wang | G09G 3/3677 |
| 2024/0203315 A1* | 6/2024 | Hong | G09G 3/2074 |
| 2024/0221564 A1* | 7/2024 | Tian | G09G 3/20 |

* cited by examiner

DISPLAY DEVICE

CROSS-REFERENCE TO RELATED APPLICATION

The present application claims priority from Japanese Application JP2023-139214, filed on Aug. 29, 2023, the content of which is hereby incorporated by reference into this application.

BACKGROUND OF THE INVENTION

Field of the Invention

The present disclosure relates to a display device provided with protection circuits that protect, from overcurrent, gate driver circuits of a double-side gate-drive gate-on-array (GOA) panel that drives a pixel array by using the gate driver circuits, which are disposed on both sides of the pixel array.

Description of the Related Art

A protection circuit is known (Japanese Unexamined Patent Application Publication No. 2014-016577) in which overcurrent detectors are couple to the respective high-voltage and low-voltage sides of a switching transistor, and that outputs a shutdown signal for shutting down a driver circuit in response to a prescribed number of times or more of overcurrent detection equal to or more than twice in a counter that counts the number of times of overcurrent detection.

In a double-side gate-drive GOA panel, which is provided with gate driver circuits disposed on both sides of a pixel array to drive the pixel array, overcurrent flows upon a defect occurred in the gate driver circuit on one side of the pixel array, and accordingly, a power management integrated circuit (PMIC) or level shifter on a timing control (TCON) substrate limits the overcurrent to shut down the gate voltage of the gate driver circuits on both sides of the display panel.

This causes the whole display on the display panel to disappear, unfortunately making it difficult to find out the cause of the defect in the gate driver circuit.

SUMMARY OF THE INVENTION

It is an object of one aspect of the present disclosure to achieve a display device that can maintain display even after overcurrent flows through a gate driver circuit on one side of a double-side gate-drive GOA panel.

To solve the above problem, a display device according to one aspect of the present disclosure is provided with a display panel including the following: a pixel array including a plurality of pixels; a plurality of gate bus lines connected to the pixel array; a first gate driver circuit disposed on one side of the pixel array, and configured to supply a scan signal to the plurality of gate bus lines; and a second gate driver circuit disposed opposite the first gate driver circuit with respect to the pixel array, and configured to supply a scan signal to the plurality of gate bus lines. The display device is also provided with the following: a first protection circuit configured to detect a first overcurrent supplied to the first gate driver circuit to protect the first gate driver circuit from the first overcurrent; and a second protection circuit different from the first protection circuit, and configured to detect a second overcurrent supplied to the second gate driver circuit to protect the second gate driver circuit from the second overcurrent.

The aspect of the present disclosure enables the display to be maintained even after the overcurrent flows through the gate driver circuit on one side of the double-side gate-drive GOA panel.

DETAILED DESCRIPTION OF THE INVENTION

First Embodiment

Figure 1:
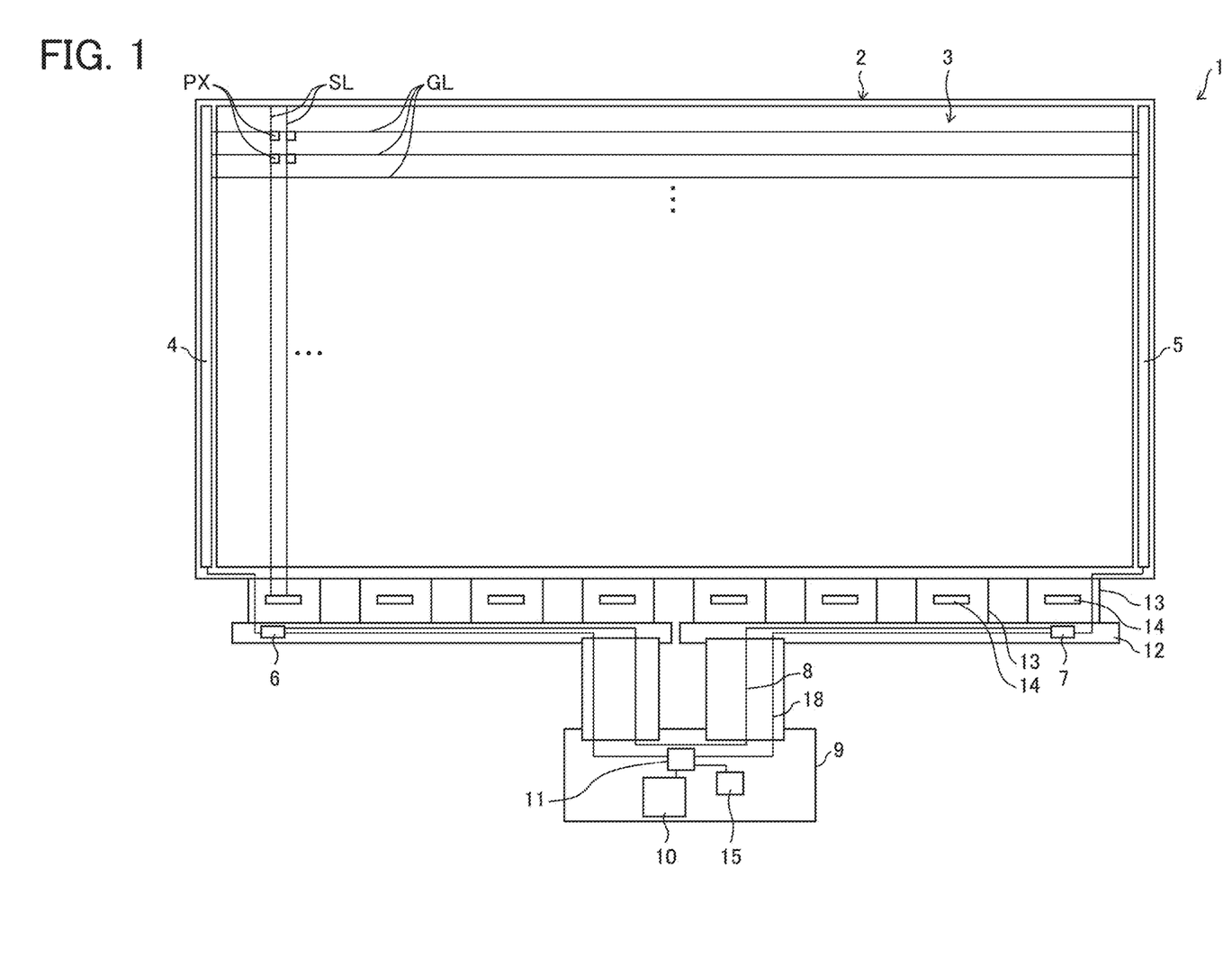
FIG. 1 is a schematic diagram of a display device according to a first embodiment.

One embodiment of present disclosure will be detailed. FIG. 1 is a schematic diagram of a display device 1 according to the first embodiment.

The display device 1 is provided with a display panel 2. The display panel 2 includes the following: a pixel array 3 including a plurality of pixels PX; a plurality of gate bus lines GL connected to the pixel array 3; a first gate driver circuit 4 disposed on one side of the pixel array 3, and configured to supply a scan signal to the plurality of gate bus lines GL; and a second gate driver circuit 5 disposed opposite the first gate driver circuit 4 with respect to the pixel array 3, and configured to supply a scan signal to the plurality of gate bus lines GL.

The scan signals are signals that are applied from the first gate driver circuit 4 and second gate driver circuit 5 to the gate bus lines GL so that the plurality of gate bus lines GL are selected sequentially.

The display device 1 is further provided with the following: a first protection circuit 6 configured to detect first overcurrent supplied to the first gate driver circuit 4 to protect the first gate driver circuit 4 from the first overcurrent; and a second protection circuit 7 different from the first protection circuit 6, and configured to detect second overcurrent supplied to the second gate driver circuit 5 to protect the second gate driver circuit 5 from the second overcurrent.

The first overcurrent is current flowing toward the first gate driver circuit 4 in order to operate the first gate driver circuit 4 and is current exceeding a current value that is allowable for the first gate driver circuit 4. The second overcurrent is current flowing toward the second gate driver circuit 5 in order to operate the second gate driver circuit 5 and is current exceeding a current value that is allowable for the second gate driver circuit 5. The allowable current value for the first gate driver circuit 4 and the allowable current value for the second gate driver circuit 5 may be identical or different.

As described above, the display device 1 has the display panel 2 that is a double-side gate-drive GOA panel. The GOA panel is a display panel having gate drivers on its glass substrate. The display device 1 is also provided with the following: the first protection circuit 6 configured to detect the first overcurrent supplied to the first gate driver circuit 4 to protect the first gate driver circuit 4 from the first overcurrent; and the second protection circuit 7 configured to detect the second overcurrent supplied to the second gate driver circuit 5 to protect the second gate driver circuit 5 from the second overcurrent. The first protection circuit 6 and the second protection circuit 7 are different circuits.

The display device 1 is further provided with a protection-circuits connecting wire 8 connecting the first protection circuit 6 and second protection circuit 7 together, and the protection-circuits connecting wire 8 is supplied with a notification signal for notifying detection of the first or second overcurrent.

Upon detecting the first overcurrent, the first protection circuit 6 supplies the notification signal for notifying the detection of the first overcurrent to the protection-circuits connecting wire 8. Then, the second protection circuit 7 receives, via the protection-circuits connecting wire 8, the notification signal supplied from the first protection circuit 6, and the second protection circuit 7 is thus notified of the fact that the first protection circuit 6 has detected the first overcurrent (as well as the fact that the first protection circuit 6 has shut off the first overcurrent supplied to the first gate driver circuit 4).

Upon detecting the second overcurrent, the second protection circuit 7 operates in a converse manner. That is, the second protection circuit 7 supplies the notification signal for notifying the detection of the second overcurrent to the protection-circuits connecting wire 8. Then, the first protection circuit 6 receives, via the protection-circuits connecting wire 8, the notification signal supplied from the second protection circuit 7, and the first protection circuit 6 is thus notified of the fact that the second protection circuit 7 has detected the second overcurrent (as well as the fact that the second protection circuit 7 has shut off the second overcurrent supplied to the second gate driver circuit 5).

The first protection circuit 6 switches a setting value in the first protection circuit 6 in response to the reception of the notification signal. The first protection circuit 6 in this embodiment switches a threshold for detecting the first overcurrent in response to the reception of the notification signal. The threshold for overcurrent detection (hereinafter, also referred to as an overcurrent-detection threshold) is one setting value in the first protection circuit 6 or second protection circuit 7.

For instance, the first protection circuit 6 and the second protection circuit 7 are connected together through the protection-circuits connecting wire 8, and the protection-circuits connecting wire 8 is pulled up. Upon detecting overcurrent, one of the first protection circuit 6 and second protection circuit 7 stops current supply to the corresponding gate driver circuit and supplies the notification signal (in this embodiment, a low-level signal) to the protection-circuits connecting wire 8. In response to the reception of the notification signal (i.e., in response to the supply of the low-level signal to the protection-circuits connecting wire 8), the other one of the first protection circuit 6 and second protection circuit 7 switches the setting for overcurrent protection.

The display device 1 is further provided with the following: a plurality of source bus lines SL connected to the pixel array 3; a source driver circuit 14 configured to supply a video signal to the plurality of source bus lines SL; and a source substrate 12 connected to the display panel 2 via a flexible circuit board 13 provided with the source driver circuit 14. The first protection circuit 6 and the second protection circuit 7 are disposed on the source substrate 12.

In the case of FIG. 1, where the display device 1 is provided with a plurality of source substrates 12 connected to the display panel 2 via a plurality of flexible circuit boards 13, the first protection circuit 6 is disposed on one of the plurality of source substrates 12, and the second protection circuit 7 is disposed on another one of the plurality of source substrates 12, for instance. The display device 1 is provided with a control substrate 9 connected to the plurality of individual source substrates 12 via flexible flat cables (FFCs).

In this case, the protection-circuits connecting wire 8 is connected from the first protection circuit 6 to the second protection circuit 7 by way of one of the source substrates 12, followed by the FFC connected to this source substrate 12, followed by the control substrate 9, followed by the FFC connected to another one of the source substrates, followed by the other source substrate 12, as illustrated in FIG. 1. It is noted that when the display device 1 has a single source substrate 12, the first protection circuit 6 and the second protection circuit 7 are disposed on the same source substrate 12.

Any short circuit in the first gate driver circuit 4 and second gate driver circuit 5 causes overcurrent to flow through the first gate driver circuit 4 and second gate driver circuit 5; such a short circuit occurs when the first gate driver circuit 4 and second gate driver circuit 5 have a chip due to hitting of the display panel 2 during a process for manufacturing the display device 1, or when an insulating film has an insulation breakdown due to temporal change of dust or other things entered in a TFT process step.

Conventionally, an overcurrent protecting circuit (a function in which a power management IC (PMIC) 15 or level shifter on the control substrate 9 limits overcurrent) has been used that is connected to both the first gate driver circuit 4 and the second gate driver circuit 5 to protect both from overcurrent. As such, overcurrent, if occurring in either of the first gate driver circuit 4 and second gate driver circuit 5, shuts down the whole pixel array 3, thereby failing to continue the display on the display panel 2 any longer.

In contrast to this, the display device 1 according to this embodiment is provided with overcurrent protecting circuits separately for the respective first gate driver circuit 4 and second gate driver circuit 5. Consequently, this embodiment enables stopping of current supply to only one of the gate driver circuits in the event of overcurrent in the gate driver circuit, so that the display panel 2 can continue display by using the other gate driver circuit.

Further, when the display device 1 that originally functions as a double-side gate driver operates in a single-side gate drive mode (a gate drive mode in which a single gate driver circuit provided on either the right or left side of the display panel 2 operates), the load on the (normal) gate driver circuit driving the pixel array 3 increases, thus possibly increasing the current flowing through the gate driver circuit. Hence, if the overcurrent protecting circuit for one of the gate driver circuits operates at an overcurrent-protection setting value for the double-side gate drive mode, the current flowing through the gate driver circuit increases, so that the overcurrent protecting circuit may possibly determine the increased current as overcurrent.

In this embodiment however, when the overcurrent protecting circuit (e.g., first protection circuit 6) for one of the gate driver circuits detects overcurrent to thus perform circuit protection (stop current supply), the overcurrent protecting circuit (e.g., second protection circuit 7) for the other gate driver circuit can be notified of this overcurrent detection via the protection-circuits connecting wire 8, so that the setting in the overcurrent protecting circuit for the other gate driver circuit can be switched. For instance, an overcurrent-detection threshold in the overcurrent protecting circuit for the other gate driver circuit can be increased. This can protect the other gate driver circuit properly in view of fluctuations in the load thereon, so that the other gate driver circuit can stably continue to drive the pixel array 3.

Figure 2:
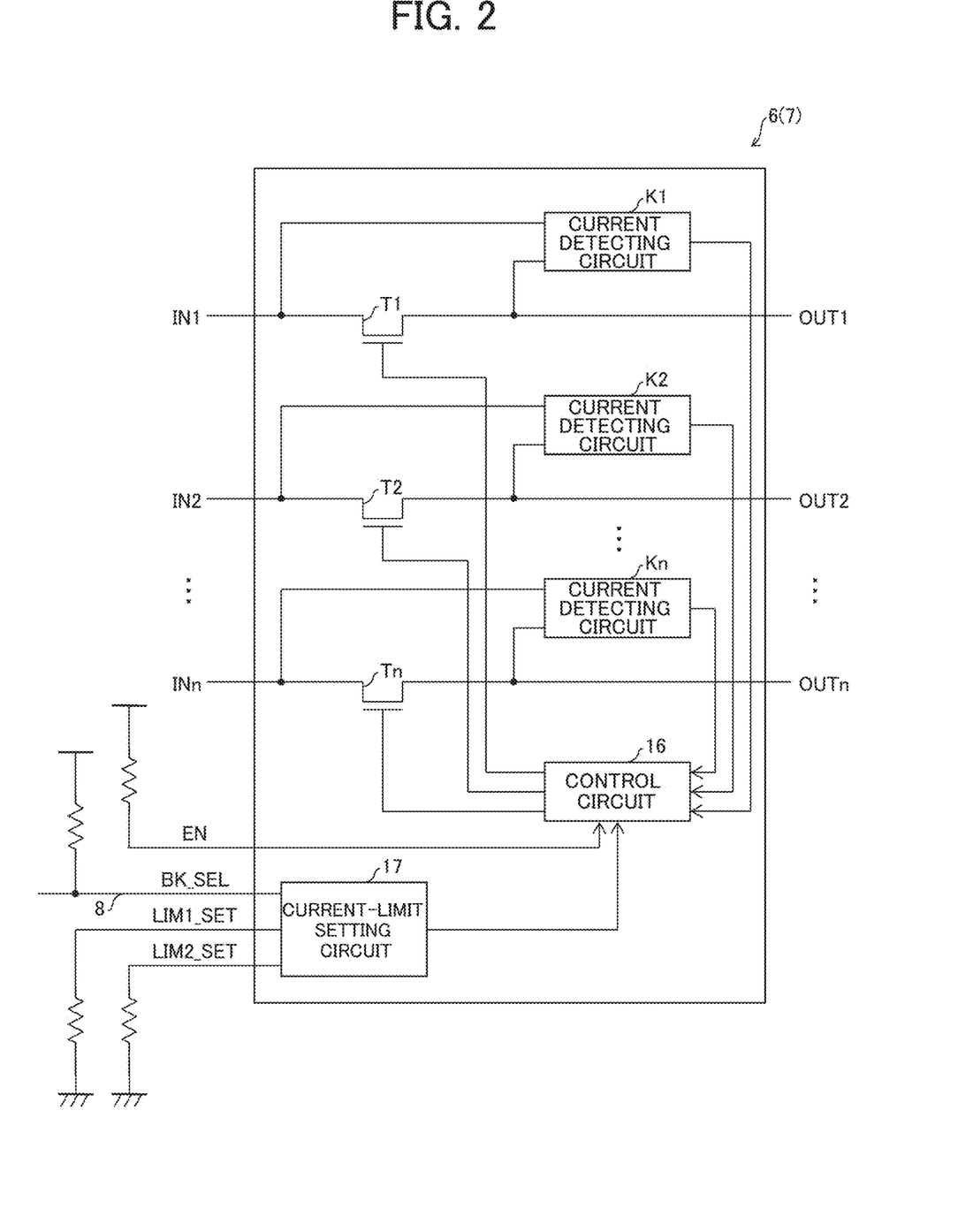
FIG. 2 is a circuit diagram of a first protection circuit provided in the display device.

FIG. 2 is a circuit diagram of the first protection circuit 6 provided in the display device 1. Constituents similar to the foregoing constituents will be denoted by like reference signs. The description of these constituents will not be detailed. The second protection circuit 7 is configured in a manner similar to that in the first protection circuit 6.

The first protection circuit 6 and/or the second protection circuit 7 includes the following: transistors T1, T2, . . . , and Tn respectively connected to input wires IN1, IN2, . . . , and INn, and to output wires OUT1, OUT2, . . . , and OUTn; current detecting circuits K1, K2, . . . , and Kn respectively connected to the transistors T1, T2, . . . , and Tn; and a control circuit 16 that controls the transistors T1, T2, . . . , and Tn in accordance with outputs from the current detecting circuits K1, K2, . . . , and Kn.

As described above, the first protection circuit 6 is connected to the plurality of input wires IN1, IN2, . . . , and INn and output wires OUT1, OUT2, . . . , and OUTn, as illustrated in FIG. 2. The first protection circuit 6 also has the transistors T1, T2, . . . , and Tn between the input wires IN1, IN2, . . . , and INn and the output wires OUT1, OUT2, . . . , and OUTn, so as to be able to shut off the first overcurrent occurred in the input wires IN1, IN2, . . . , and INn. The voltage between the sources and drains of the transistors T1, T2, . . . , and Tn is used for the current detection. Upon the output voltage from the current detecting circuits K1, K2, . . . , and Kn reaching a value higher than a reference voltage output from a current-limit setting circuit 17, the control circuit 16 closes the gates of the transistors T1, T2, . . . , and Tn to shut off the first overcurrent occurred in the input wires IN1, IN2, . . . , and INn.

The plurality of input wires IN1, IN2, . . . , and INn and output wires OUT1, OUT2, . . . , and OUTn correspond to wires (hereinafter, referred to as gate control wires 18) for inputting various signals (e.g., a clock signal and a reference voltage signals) from the timing controller 10 to the first gate driver circuit 4 or second gate driver circuit 5; that is, these input and output wires correspond to wires extending from the timing controller 10 to the first gate driver circuit 4 or second gate driver circuit 5 illustrated in FIG. 1. Further, FIG. 1 illustrates only one gate control wire 18 in order to simplify the illustration for easy understanding, but in reality, there are a plurality of gate control wires arranged in parallel with one another, as illustrated in FIG. 2.

The control circuit 16 at this time shuts off the first overcurrent of all the input wires IN1, IN2, . . . , and INn upon any one of the current detecting circuits K1, K2, . . . , and Kn having a current exceeding a limit current (overcurrent-detection threshold).

If overcurrent occurs in the first gate driver circuit 4, the potential difference between the sources and drains of the transistors T1, T2, . . . , and Tn of the first protection circuit 6 increases and exceeds the overcurrent-detection threshold of the first protection circuit 6. Based on the fact that the voltage (voltage indicating the potential difference between the sources and drains of the transistors T1, T2, . . . , and Tn of the first protection circuit 6) received from the current detecting circuits K1, K2, . . . , and Kn has exceeded the reference voltage (overcurrent-detection threshold of the first protection circuit 6) output from the current-limit setting circuit 17, the control circuit 16 of the first protection circuit 6 detects the first overcurrent and closes the gates of the transistors T1, T2, . . . , and Tn of the first protection circuit 6 to shut off the first overcurrent.

The second protection circuit 7 operates in a manner similar to that in the first protection circuit 6. That is, if overcurrent occurs in the second gate driver circuit 5, the potential difference between the sources and drains of the transistors T1, T2, . . . , and Tn of the second protection circuit 7 increases and exceeds the overcurrent-detection threshold of the second protection circuit 7. Based on the fact that the voltage (voltage indicating the potential difference between the sources and drains of the transistors T1, T2, . . . , and Tn of the second protection circuit 7) received from the current detecting circuits K1, K2, . . . , and Kn has exceeded the reference voltage (overcurrent-detection threshold of the second protection circuit 7) output from the current-limit setting circuit 17, the control circuit 16 of the second protection circuit 7 detects the second overcurrent and closes the gates of the transistors T1, T2, . . . , and Tn of the second protection circuit 7 to shut off the second overcurrent.

These reference voltages are each a voltage corresponding to a threshold selected by the current-limit setting circuit 17 from either a threshold LIM1_SET or threshold LIM2_SET for overcurrent detection in accordance with the level of a notification signal from an input/output terminal BK_SEL.

The current-limit setting circuit 17 is connected to a first resistor corresponding to the threshold LIM1_SET, and a second resistor corresponding to the threshold LIM2_SET. The reference voltage output from the current-limit setting circuit 17 can be determined based on the resistances of the first and second resistors.

The current-limit setting circuit 17 has the open-drain input/output terminal BK_SEL. The input/output terminal BK_SEL of the current-limit setting circuit 17 in the first protection circuit 6, and the input/output terminal BK_SEL of the current-limit setting circuit 17 in the second protection circuit 7 are connected together through the protection-circuits connecting wire 8. Upon the control circuit 16 detecting and shutting off overcurrent, the current-limit setting circuit 17 outputs a low-level signal (notification signal) to the protection-circuits connecting wire 8 via the input/output terminal BK_SEL.

During a normal operation in which the control circuit 16 detects no overcurrent, the potential of the protection-circuits connecting wire 8 is kept at a high level. Both of the first protection circuit 6 and second protection circuit 7 at this time performs overcurrent protection with the threshold LIM1_SET as an overcurrent-detection threshold. Then, for instance, upon the first protection circuit 6 detecting the first overcurrent, and upon its current-limit setting circuit 17 outputting a low-level signal (notification signal) to the protection-circuits connecting wire 8 via the input/output terminal BK_SEL, the second protection circuit 7 performs overcurrent protection by changing the overcurrent-detection threshold from the threshold LIM1_SET to the threshold LIM2_SET in response to the reception of the notification signal. Here, the threshold LIM2_SET is larger than the threshold LIM1_SET.

The first gate driver circuit 4 or second gate driver circuit 5 consumes more current normally in a single-side gate drive mode. Hence, resistances corresponding to the respective thresholds LIM1_SET and LIM2_SET are determined in such a manner that the reference voltage corresponding to the threshold LIM2_SET is higher than the reference voltage corresponding to the threshold LIM1_SET.

Such setting can establish an overcurrent-detection threshold optimal for each of the normal, double-side gate-drive mode without overcurrent detection, and the single-side gate-drive mode after overcurrent detection, so that the first gate driver circuit 4 or second gate driver circuit 5 can be continuously driven even if the current flowing through the first gate driver circuit 4 or second gate driver circuit 5 increases in the single-side gate-drive mode. As a result, the display panel 2 can be continuously lit.

The first protection circuit 6 or the second protection circuit 7 shuts off the first overcurrent or second overcurrent of all signals (gate control signals), including a gate-start pulse signal GSP, a gate clock signal GCK, and a gate-end pulse signal GEP, supplied to the first gate driver circuit 4 and second gate driver circuit 5. The other normal one of the first gate driver circuit 4 and second gate driver circuit 5 continues to be supplied with a gate control signal and thus continues to operate; accordingly, the display panel 2 can continue display as a whole though the display on the abnormal gate driver side becomes dark.

The first protection circuit 6 is configured to select, as the threshold for detecting the first overcurrent, a plurality of thresholds including the threshold LIM1_SET (first threshold) and the threshold LIM2_SET (second threshold) higher than the threshold LIM1_SET. In response to the reception of the notification signal "L", the first protection circuit 6 switches the threshold for detecting the first overcurrent from the threshold LIM1_SET to the threshold LIM2_SET. In addition, the second protection circuit 7 is configured to select, as the threshold for detecting the second overcurrent, a plurality of thresholds including the threshold LIM1_SET (third threshold) and the threshold LIM2_SET (fourth threshold) higher than the threshold LIM1_SET. In response to the reception of the notification signal "L", the second protection circuit 7 switches the threshold for detecting the second overcurrent from the threshold LIM1_SET to the threshold LIM2_SET.

The first and third thresholds may be identical or different. Likewise, the second and fourth thresholds may be identical or different.

This embodiment is used for finding out the cause of a defect occurred in a process for manufacturing the display device 1. Other than this case, possible cases are listed below.

A case in which sudden display disappearance resulting from a defect occurred due to aging degradation in the display device 1 or other factors causes inconvenience.

A case in which a defective gate driver circuit undergoes removal from the display panel (re-sizing) through laser processing or other processing, so that the display panel is used as a single-side gate-drive display panel.

In the single-side gate drive mode for finding out the cause of a defect, the reason why an overcurrent protecting circuit is needed for a gate driver circuit that is to be driven is as follows.

Without an overcurrent protecting circuit at the time of the inspection for the cause of a defect, the overcurrent protecting circuit provided in the power management IC 15 operates to thus stop voltage for not only the gate driver circuit, but also the source driver circuit 14. Accordingly, nothing is displayed on the display panel 2 any longer, thus making it difficult to find out the cause of the defect. When overcurrent protecting circuits are provided in front of the respective right-side gate driver circuit and left-side gate driver circuit, the overcurrent protecting circuit in the defective gate driver circuit operates to stop output to the defective gate driver circuit, and the display on the defective side thus becomes dark. As such, it can be identified that the cause of the defect lies in the gate driver circuit on the dark display side.

In lighting the display panel 2 having a defect in one of the gate driver circuits, the overcurrent protecting circuit in front of the normal gate driver circuit shuts off the overcurrent of a gate control signal upon input of the gate control signal with an incorrect timing, but since the gate control signal is coming in front of the overcurrent protection circuit, the cause can be identified by observing the waveform with an oscilloscope. Where there is no overcurrent protecting circuit, the power management IC 15 stops outputting gate voltages VGH and VGL, thus no longer outputting the gate control signal per se; accordingly, the cause is difficult to identify. It is noted that these protection circuits provided in the power management IC 15 against the overcurrent of the gate voltages VGH and VGL are not essential constituents in this embodiment.

The display device 1 is further provided with a third protection circuit disposed on the control substrate 9 provided with the timing controller 10, which controls the timing for operating the first gate driver circuit 4 and the second gate driver circuit 5, the third protection circuit being configured to detect the first overcurrent and the second overcurrent to protect the first gate driver circuit 4 and the second gate driver circuit 5 from the first overcurrent and the second overcurrent. The third protection circuit can correspond to an overcurrent protecting circuit provided in the level shifter or power management IC 15. The following describes an instance in which the third protection circuit corresponds to an overcurrent protecting circuit provided in the level shifter.

The third protection circuit, 11, operates as a level shifter. The third protection circuit 11 is connected to the first gate driver circuit 4 via the gate control wires 18 and the first protection circuit 6, and to the second gate driver circuit 5 via the gate control wires 18 and the second protection circuit 7.

A threshold for detecting the first overcurrent in the third protection circuit 11 is higher than the threshold for detecting the first overcurrent in the first protection circuit 6, and a threshold for detecting the second overcurrent in the third protection circuit 11 is higher than the threshold for detecting the second overcurrent in the second protection circuit 7.

In the above configuration, the threshold in the first protection circuit 6 and the threshold in the second protection circuit 7 are lower than the thresholds in the third protection circuit 11; thus, the third protection circuit 11 operates before the first protection circuit 6 and the second protection circuit 7, so that an incident: the whole display on the display panel 2 disappears, can be avoided.

The drawing illustrates, by way of example, that the first protection circuit 6 and the second protection circuit 7 are disposed on the source substrates 12. The first protection circuit 6 and the second protection circuit 7 may be disposed on the control substrate 9.

When the first protection circuit 6 and the second protection circuit 7 are disposed on the source substrates 12, transmission loss and the influence of reflection are small on the source substrates 12, so that the threshold LIM1_SET in the first protection circuit 6 and the threshold LIM42_SET in the second protection circuit 7 can be set in view of only the properties of the gate driver circuits on the GOA panel. This eliminates the need to establish the threshold LIM1_SET in the first protection circuit 6 and the threshold LIM2_SET in the second protection circuit 7 in view of a margin reflecting the transmission loss and the influence of reflection.

When the first protection circuit 6 and the second protection circuit 7 are disposed on the control substrate 9, these protection circuits can be collectively mounted on a single chip, the control substrate 9. This enables the protection-circuits connecting wire 8, connecting the first protection circuit 6 and second protection circuit 7 together, to be formed at a short length within a single chip, thereby avoiding the number of terminals necessary for a connector that connects the control substrate 9 and source substrate 12 together from increasing by the length of the protection-circuits connecting wire 8.

In this embodiment, the double-side gate-drive GOA panel is configured, as described above, such that the first protection circuit 6 and the second protection circuit 7, which are for protection against overcurrent related to a gate control signal, are additionally provided on the source substrates 12; if a defect occurs in the gate driver circuit on one side of the display panel 2, thus causing overcurrent flow, this configuration can stop output from the defective gate driver circuit and continue to drive the pixel array 3 by the use of the normal gate driver circuit. The double-side gate-drive GOA panel is also configured such that the first protection circuit 6 and the second protection circuit 7 operate in coordination; if a defect occurs in the gate driver circuit on one side of the display panel 2, thus causing overcurrent flow, this configuration can switch an overcurrent-detection threshold in the protection circuit connected to the normal gate driver circuit to a suitable overcurrent-detection threshold corresponding to a change in consumed current resulting from the fact that the panel is now in a single-side gate drive mode, so that the pixel array 3 can be continuously driven properly by the use of the normal gate driver circuit.

Second Embodiment

Figure 3:
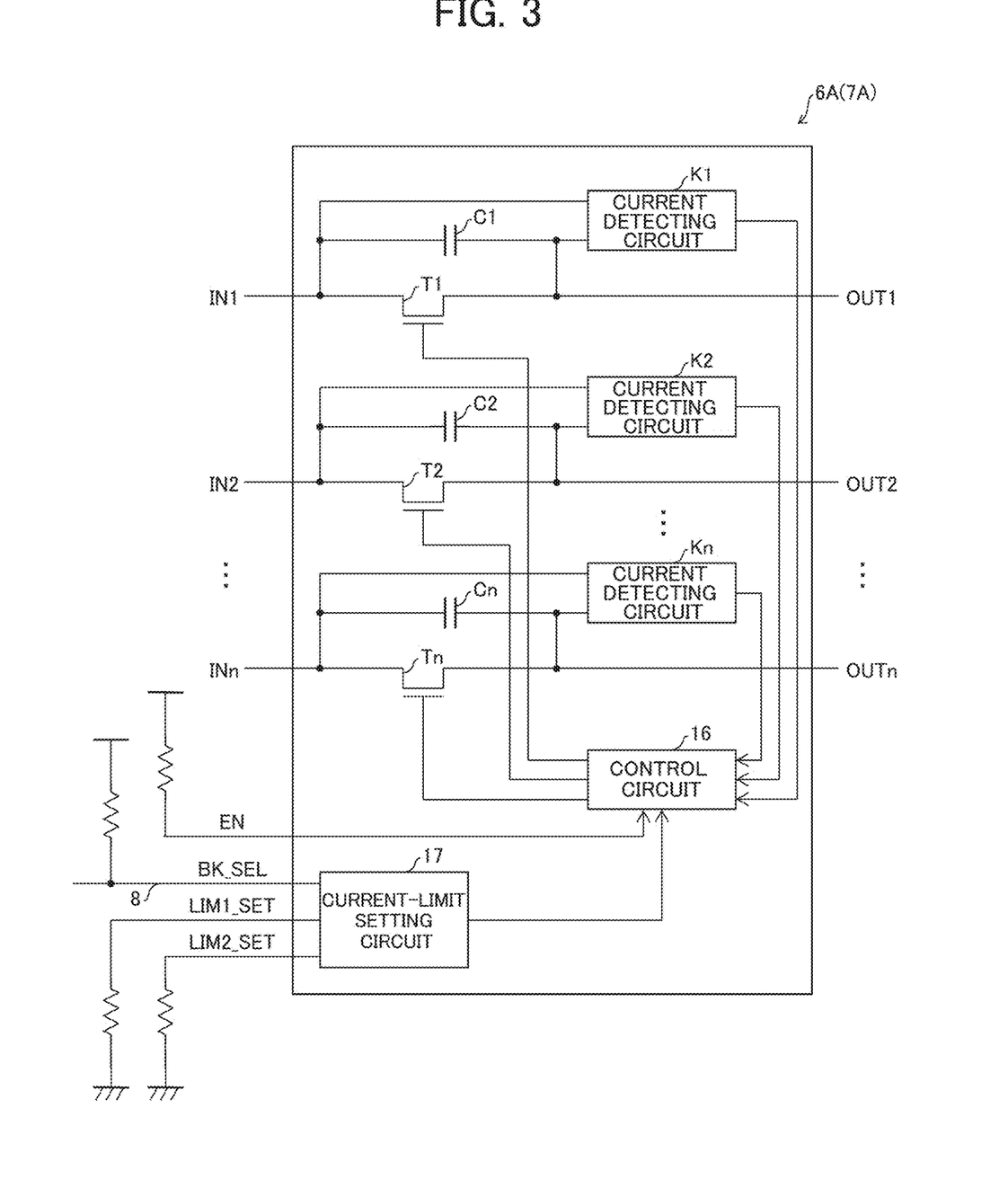
FIG. 3 is a circuit diagram of a first protection circuit provided in a display device according to a second embodiment.
Figure 4:
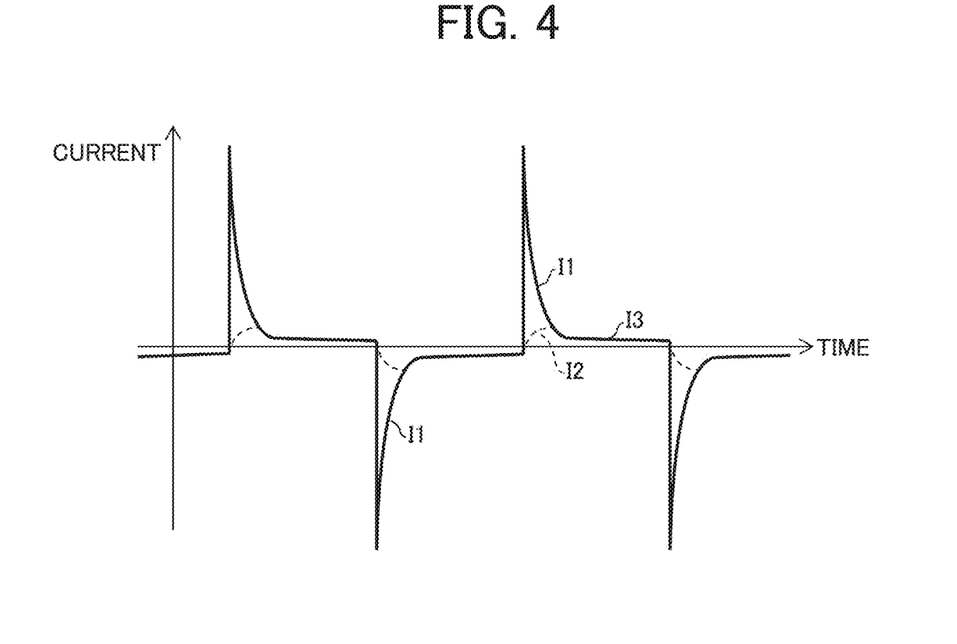
FIG. 4 is a waveform chart illustrating current flowing through a gate clock wire during the normal operation of the display device.
Figure 5:
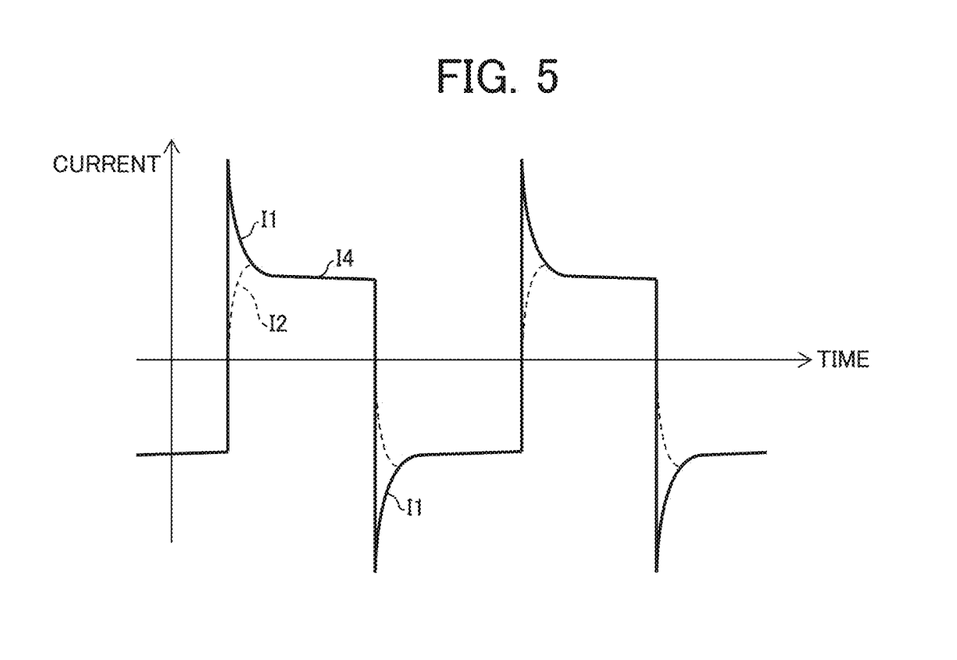
FIG. 5 is a waveform chart illustrating overcurrent flowing through the gate clock wire.

FIG. 3 is a circuit diagram of a first protection circuit 6A provided in a display device according to a second embodiment. FIG. 4 is a waveform chart illustrating a normal current I3 flowing through the gate control wires 18 during the normal operation of the display device. FIG. 5 is a waveform chart illustrating an overcurrent I4 flowing through the gate control wires 18. Constituents similar to the foregoing constituents will be denoted by like reference signs, and their description will not be detailed. A second protection circuit 7A is configured in a manner similar to that in the first protection circuit 6A.

The first protection circuit 6A may further include capacitors C1, C2, . . . , and Cn respectively connected in parallel to the transistors T1, T2, . . . , and Tn.

A peak current I1 is seen at the rising and falling edges of an input signal input to the input wires IN1, IN2, . . . , and INn.

Then, connecting the capacitors C1, C2, . . . , and Cn in parallel to the input shut-off transistors T1, T2, . . . , and Tn, provided in the first protection circuit 6 and second protection circuit 7 according to the first embodiment, causes the peak current I1 to vanish and causes an incremental current I2 to flow instead. The normal current I3 flows during a normal operation mode in which no overcurrent is detected. Moreover, the overcurrent I4, which is larger than the normal current I3, flows during an abnormal operation mode in which overcurrent is detected.

The peak current I1, if flowing at the rising and falling edges of an input signal, is detected as overcurrent. To avoid this situation, there is no choice but to set a threshold for overcurrent detection higher than the peak current I1.

In contrast to this, providing the capacitors C1, C2, . . . , and Cn as described in this embodiment allows the incremental current I2, which is much smaller than the peak current I1, to flow, so that the peak current I1 is not detected as overcurrent, and that the overcurrent I4 is detected, thereby enabling the threshold for overcurrent detection to be set lower than the peak current I1. As a result, for the overcurrent I4 lower than the peak current I1, as shown in FIG. 5, the overcurrent I4 of a gate control signal of the input wires IN1, IN2, . . . , and INn can be shut off.

Third Embodiment

Figure 6:
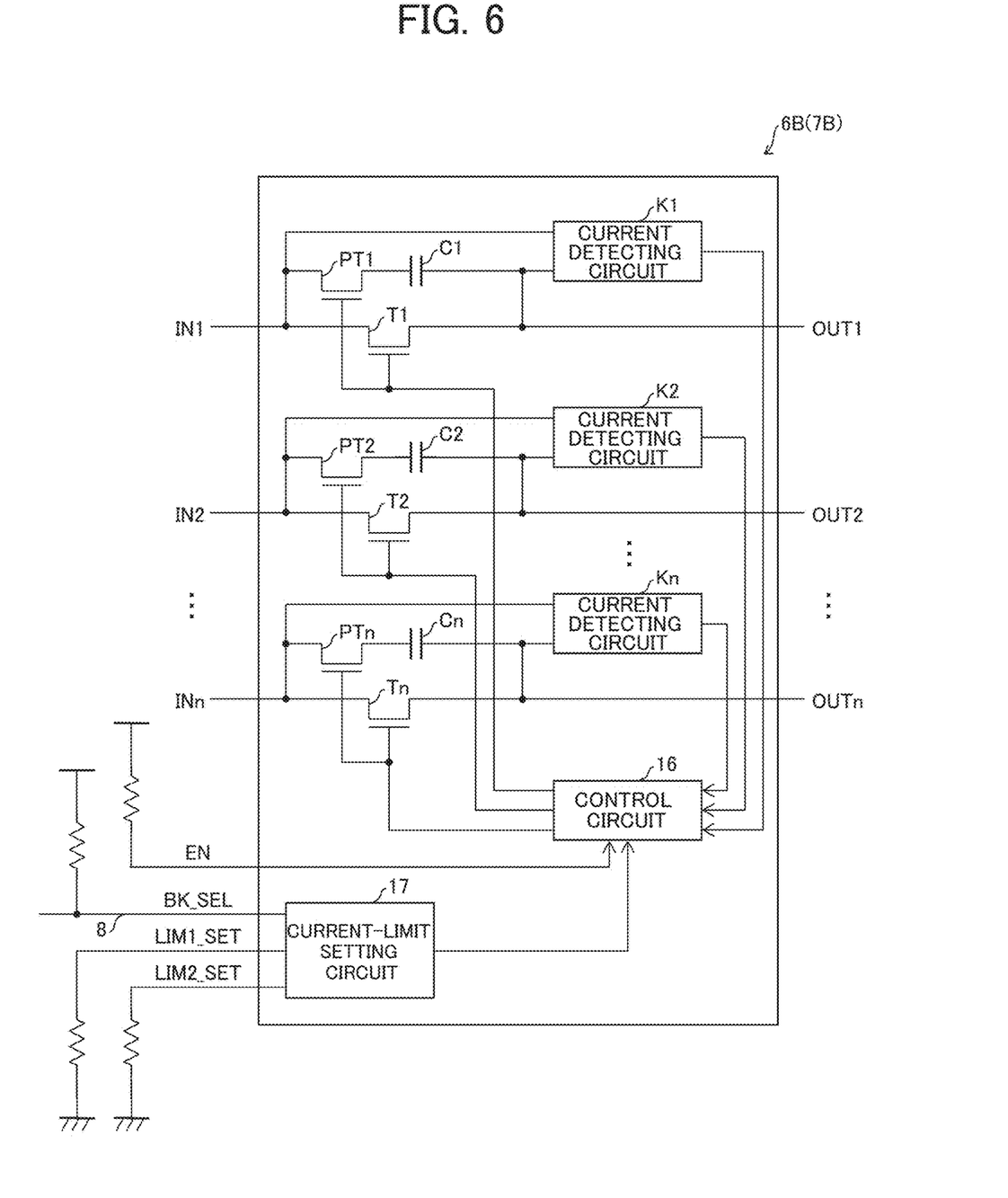
FIG. 6 is a circuit diagram of a first protection circuit provided in a display device according to a third embodiment.
Figure 7:
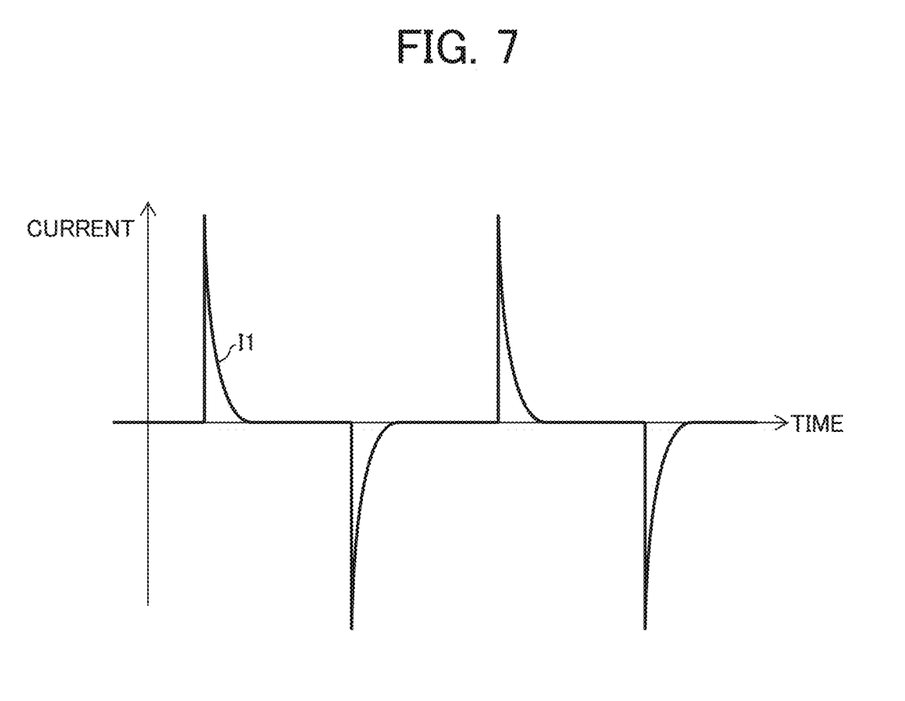
FIG. 7 is a waveform chart illustrating peak current flowing through a gate clock wire.

FIG. 6 is a circuit diagram of a first protection circuit 6B/second protection circuit 7B provided in a display device according to a third embodiment. FIG. 7 is a waveform chart illustrating the peak current I1 flowing through the gate control wires 18. Constituents similar to the foregoing constituents will be denoted by like reference signs. The description of these constituents will not be detailed. The second protection circuit 7B is configured in a manner similar to that in the first protection circuit 6B.

The first protection circuit 6B may further include peak-current shut-off transistors PT1, P2, . . . , and PTn respectively connected in series to the capacitors C1, C2, . . . , and Cn.

In the second embodiment, where the first protection circuit 6A includes no peak-current shut-off transistors PT1, P2, . . . , and PTn, the peak current I1 leaks after the overcurrent of a gate control signal is detected and shut off, as shown in FIG. 7.

However, the first protection circuit 6B according to this embodiment is configured such that the peak-current shut-off transistors PT1, PT2, . . . , and PTn are respectively connected to the capacitors C1, C2, . . . , and Cn, which are used for bypassing peak current. This configuration can shut off the peak current I1 as well after shutting off the overcurrent of the gate control signal.

Fourth Embodiment

Figure 8:
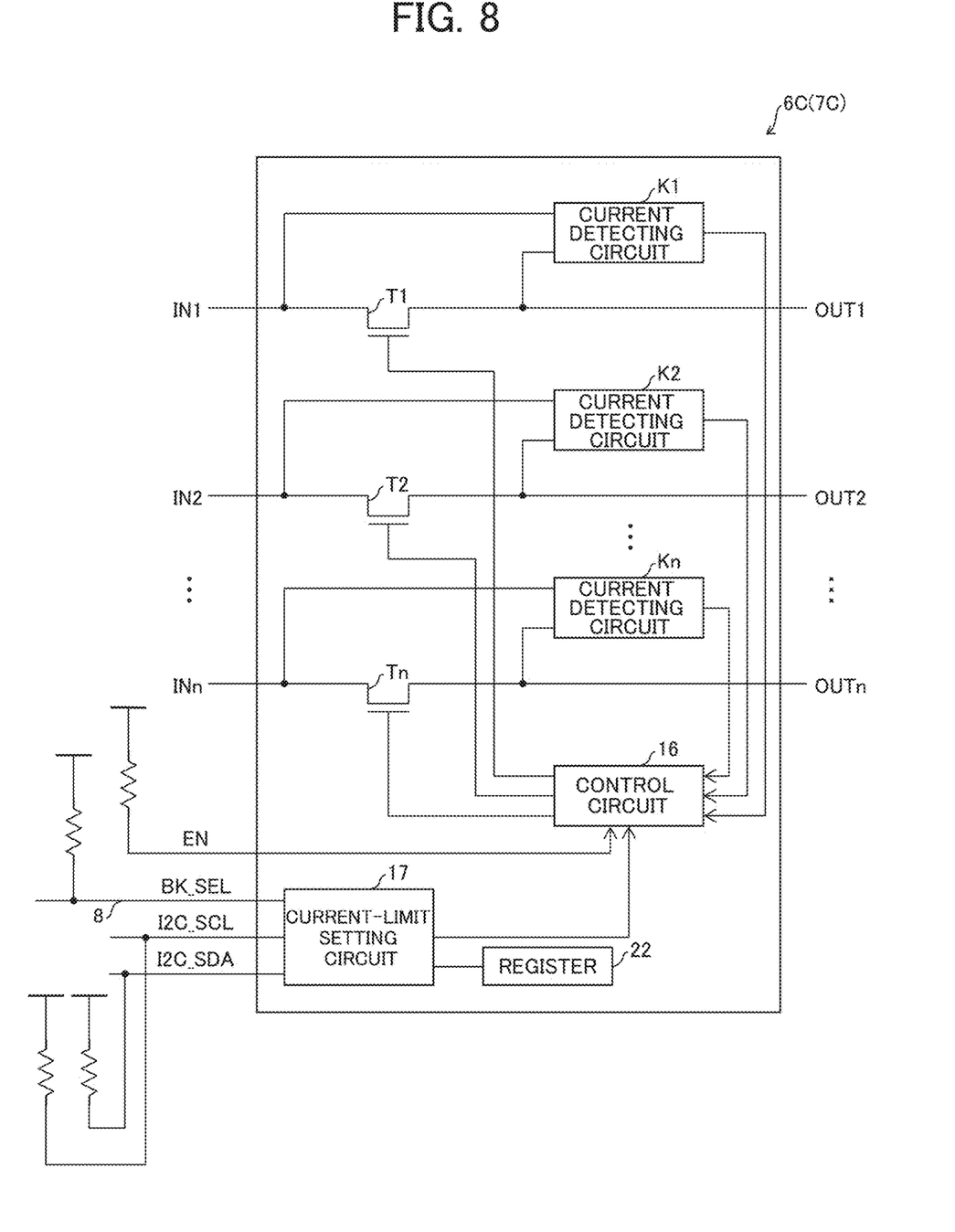
FIG. 8 is a circuit diagram of a first protection circuit provided in a display device according to a fourth embodiment.

FIG. 8 is a circuit diagram of a first protection circuit 6C provided in a display device according to a fourth embodiment. Constituents similar to the foregoing constituents will be denoted by like reference signs, and their description will not be detailed. A second protection circuit 7C is configured in a manner similar to that in the first protection circuit 6C.

The first protection circuit 6C may include a resistor 22 in which a setting value switched in response to the reception of a notification signal "L" is input. In this way, a threshold for overcurrent protection may be set in a digital circuit rather than in an analog circuit.

FIG. 8 illustrates, by way of example, a configuration enabling a threshold for overcurrent protection to be set in the resistor 22. The current-limit setting circuit 17 writes a value into the register 22 in accordance with the Inter-Integrated Circuit (I2C) serial communication standard, and the setting value of the resister 22 is stored in an electrically erasable and programmable read only memory (EEPROM, registered trademark) or a flash read only memory (ROM).

TABLE 1

| Register | |
|---|---|
| Bank0 | |
| Clim0 | Current for Performing Overcurrent Protection |
| Tpw0 | Peak-Current Ignoring Period |
| Bank1 | |
| Clim1 | Current for Performing Overcurrent Protection |
| Tpw1 | Peak-Current Ignoring Period |

The register 22 includes registers Clim0 and Clim1 for determining current thresholds at which the first protection circuit 6C operates for overcurrent protection, and registers Tpw0 and Tpw1 for setting peak-current ignoring periods during which the peak current I1 is ignored. In this way, the setting value in the first protection circuit 6C may include a peak-current ignoring period in addition to a threshold for overcurrent protection.

The setting value can be separated into a setting Bank0 and a setting Bank1. The setting value of the setting Bank0 is applied when the notification signal supplied to the protection-circuits connecting wire 8 connected to the input/output terminal BK_SEL stands at "H", and the setting value of the setting Bank1 is applied when the notification signal supplied to the protection-circuits connecting wire 8 connected to the input/output terminal BK_SEL stands at "L". Setting the register Clim1 at a larger value than the register Clim0 can achieve an effect similar to that in the third embodiment.

Further, the width of the peak current I1 at the time of switching between "H" and "L" of the notification signal also increases in the single-side gate drive mode. Accordingly, setting the register Tpw1 at a larger setting value than the resistor Tpw0 can lower the setting value of the resistor Clim1.

The current for operating the first protection circuit 6C for overcurrent protection is set based on a resistor's value, so that the setting value can be changed easily.

SUMMARY

A display panel 1 according to a first aspect of the present disclosure is provided with a display panel 2 including the following: a pixel array 3 including a plurality of pixels PX; a plurality of gate bus lines GL connected to the pixel array 3; a first gate driver circuit 4 disposed on one side of the pixel array 3, and configured to supply a scan signal to the plurality of gate bus lines GL; and a second gate driver circuit 5 disposed opposite the first gate driver circuit 4 with respect to the pixel array 3, and configured to supply a scan signal to the plurality of gate bus lines GL. The display device 1 is further provided with the following: a first protection circuit 6, 6A, 6B, 6C configured to detect a first overcurrent supplied to the first gate driver circuit 4 to protect the first gate driver circuit 4 from the first overcurrent; and a second protection circuit 7, 7A, 7B, 7C different from the first protection circuit 6, 6A, 6B, 6C, and configured to detect a second overcurrent supplied to the second gate driver circuit 5 to protect the second gate driver circuit 5 from the second overcurrent.

The following is provided in the above configuration: the first protection circuit configured to detect the first overcurrent supplied to the first gate driver circuit to protect the first gate driver circuit from the first overcurrent; and the second protection circuit different from the first protection circuit, and configured to detect the second overcurrent supplied to the second gate driver circuit to protect the second gate driver circuit from the second overcurrent. As such, upon the first protection circuit detecting overcurrent, the first gate driver circuit stops operating, whereas the second gate driver circuit can continue operating. This can maintain the display on the display panel as a whole even when a double-side gate-drive GOA panel is driven by the gate driver circuit on one side.

The display device 1 according to a second aspect of the present disclosure is, in the first aspect, preferably provided further with a protection-circuits connecting wire 8 connecting the first protection circuit 6, 6A, 6B, 6C and the second protection circuit 7, 7A, 7B, 7C together, and the protection-circuits connecting wire 8 is supplied with a notification signal for notifying detection of the first overcurrent or the second overcurrent.

The above configuration enables the first protection circuit to notify the detection of the first overcurrent to the second protection circuit and enables the second protection circuit to notify the detection of the second overcurrent to the first protection circuit.

The display device 1 according to a third aspect of the present disclosure is, in the second aspect, preferably configured such that the first protection circuit 6, 6A, 6B, 6C switches a setting value in the first protection circuit 6, 6A, 6B, 6C in response to the reception of the notification signal.

The above configuration enables the setting value in the first protection circuit to be changed properly in accordance with stopping of the second gate driver circuit, which the second protection circuit having detected the second overcurrent protects.

The display device 1 according to a fourth aspect of the present disclosure is, in the third aspect, preferably configured such that the first protection circuit 6, 6A, 6B, 6C switches a threshold LIM1_SET, LIM2_SET for detecting the first overcurrent in response to the reception of the notification signal.

The above configuration can properly change the threshold for the first protection circuit to detect the first overcurrent, in accordance with stopping of the second gate driver circuit, which the second protection circuit having detected the second overcurrent protects.

The display panel 1 according to a fifth aspect of the present disclosure is, in the fourth aspect, preferably configured such that the first protection circuit 6, 6A, 6B, 6C is configured to select, as the threshold for detecting the first overcurrent, a plurality of thresholds including a first threshold (threshold LIM1_SET) and a second threshold (threshold LIM2_SET) higher than the first threshold, and such that the first protection circuit 6, 6A, 6B, 6C switches the threshold for detecting the first overcurrent from the first threshold (threshold LIM1_SET) to the second threshold (threshold LIM2_SET) in response to the reception of the notification signal.

In the above configuration, switching the threshold from the first threshold to the second threshold in response to the reception of the notification signal can switch the threshold for detecting the first overcurrent.

The display device 1 according to a sixth aspect of the present disclosure is, in the second aspect, preferably configured such that upon detecting the second overcurrent, the second protection circuit 7, 7A, 7B, 7C shuts off the second overcurrent and supplies the notification signal to the protection-circuits connecting wire 8.

The above configuration enables the second protection circuit to notify, upon detecting the second overcurrent, the detection of the second overcurrent to the first protection circuit.

The display device 1 according to a seventh aspect of the present disclosure is, in the third aspect, preferably configured such that the second protection circuit 7, 7A, 7B, 7C switches a setting value in the second protection circuit 7, 7A, 7B, 7C in response to the reception of the notification signal.

The above configuration enables the second protection circuit to switch the setting value for detecting the second overcurrent in response to the reception of the notification signal for notifying the detection of the first overcurrent.

The display device 1 according to an eighth aspect of the present disclosure is, in the seventh aspect, preferably configured such that the first protection circuit 6, 6A, 6B, 6C switches a threshold for detecting the first overcurrent in response to the reception of the notification signal, and such that the second protection circuit 7, 7A, 7B, 7C switches a threshold LIM1_SET, LIM2_SET for detecting the second overcurrent in response to the reception of the notification signal.

In the above configuration, the threshold for the first protection circuit to detect the first overcurrent is switched in response to the reception of the notification signal for notifying that the second protection circuit has detected the second overcurrent, and the threshold for the second protection circuit to detect the second overcurrent is switched in response to the reception of the notification signal for notifying that the first protection circuit has detected the first overcurrent.

The display panel 1 according to a ninth aspect of the present disclosure is, in the eighth aspect, preferably configured such that the first protection circuit 6, 6A, 6B, 6C is configured to select, as the threshold for detecting the first overcurrent, a plurality of thresholds including a first threshold (threshold LIM1_SET) and a second threshold (threshold LIM2_SET) higher than the first threshold, such that the first protection circuit 6, 6A, 6B, 6C switches the threshold for detecting the first overcurrent from the first threshold (threshold LIM1_SET) to the second threshold (threshold LIM2_SET) in response to the reception of the notification signal, such that the second protection circuit 7, 7A, 7B, 7C is configured to select, as the threshold for detecting the second overcurrent, a plurality of thresholds including a third threshold (threshold LIM1_SET) and a fourth threshold (threshold LIM2_SET) higher than the third threshold (threshold LIM1_SET), and such that the second protection circuit 7, 7A, 7B, 7C switches the threshold for detecting the second overcurrent from the third threshold (threshold LIM1_SET) to the fourth threshold (threshold LIM2_SET) in response to the reception of the notification signal.

The above configuration enables the threshold for detecting the first overcurrent to be switched and enables the threshold for detecting the second overcurrent to be switched.

The display device 1 according to a tenth aspect of the present disclosure is, in the sixth aspect, preferably configured such that upon detecting the first overcurrent, the first protection circuit 6, 6A, 6B, 6C shuts off the first overcurrent and supplies the notification signal to the protection-circuits connecting wire 8.

The above configuration enables the first protection circuit to notify the detection of the first overcurrent to the second protection circuit.

The display panel 1 according to an eleventh aspect of the present disclosure is, in any one of the first to tenth aspects, preferably provided further with the following: a control substrate 9 provided with a timing controller 10 configured to control a timing for operating the first gate driver circuit 4 and the second gate driver circuit 5; and a third protection circuit 11 disposed on the control substrate 9, and configured to detect the first overcurrent and the second overcurrent to protect the first gate driver circuit 4 and the second gate driver circuit 5 from the first overcurrent and the second overcurrent. The display device 1 is preferably configured such that a threshold for detecting the first overcurrent in the third protection circuit 11 is higher than a threshold for detecting the first overcurrent in the first protection circuit 6, 6A, 6B, 6C, and such that a threshold for detecting the second overcurrent in the third protection circuit 11 is higher than a threshold for detecting the second overcurrent in the second protection circuit 7, 7A, 7B, 7C.

In the above configuration, the threshold in the first protection circuit and the threshold in the second protection circuit are lower than the thresholds in the third protection circuit; thus, the third protection circuit operates before the first and second protection circuits, so that an incident: the whole display on the display panel disappears, can be avoided.

The display device 1 according to a twelfth aspect of the present disclosure is, in any one of the first to tenth aspects, preferably further provided with a source substrate 12 connected to the display panel 2 via a flexible circuit board 13 provided with a source driver circuit 14 configured to supply a video signal to a plurality of source bus lines SL connected to the pixel array 3. The display device 1 is preferably configured such that the first protection circuit 6, 6A, 6B, 6C and the second protection circuit 7, 7A, 7B, 7C are disposed on the source substrate 12.

In the above configuration, transmission loss and the effect of reflection are small on the source substrate, thus enabling the thresholds in the first and second protection circuits to be set in view of only the properties of the gate driver circuits on the GOA panel. This eliminates the need for the thresholds in the first and second protection circuits to have a margin reflecting the transmission loss and the influence of reflection.

The display device 1 according to a thirteenth aspect of the present disclosure is, in any one of the first to tenth aspects, preferably further provided with the following: a source substrate 12 connected to the display panel 2 via a flexible circuit board 13 provided with a source driver circuit 14 configured to supply a video signal to a plurality of source bus lines SL connected to the pixel array 3; and a control substrate 9 connected to the source substrate 12, and provided with a timing controller 10 configured to control a timing for operating the first gate driver circuit 4, the second gate driver circuit 5, and the source driver circuit 14. The display device 1 is preferably configured such that the first protection circuit 6, 6A, 6B, 6C and the second protection circuit 7, 7A, 7B, 7C are disposed on the control substrate 9.

The above configuration enables the first and second protection circuits to be collectively mounted on a single chip, the control substrate. This enables the protection-circuits connecting wire, connecting the first and second protection circuits together, to be formed at a short length within a single chip, thereby avoiding the number of terminals necessary for a connector connecting the control substrate and source substrate together from increasing by the length of the protection-circuits connecting wire.

The display device 1 according to a fourteenth aspect of the present disclosure is, in any one of the first to tenth aspects, preferably configured such that the first protection circuit 6A, 6B and/or the second protection circuit 7A, 7B includes the following: a transistor T1, T2, . . . , Tn connected to an input wire IN1, IN2, . . . , INn and an output wire OUT1, OUT2, . . . , OUTn; a current detecting circuit K1, K2, . . . , Kn connected to the transistor T1, T2, . . . , Tn; a control circuit 16 configured to control the transistor T1, T2, . . . , Tn in response to an output from the current detecting circuit K1, K2, . . . , Kn; and a capacitor C1, C2, . . . , Cn connected in parallel to the transistor T1, T2, . . . , Tn.

In the above configuration, the capacitor is provided so as to be connected in parallel to the transistor connected to the input and output wires, thereby enabling the peak currents at the rising and falling edges of an input signal input from the input wire not to be detected as the first overcurrent and the second overcurrent. This can lower the threshold for detecting the first overcurrent, and the threshold for detecting the second overcurrent.

The display device 1 according to a fifteenth aspect of the present disclosure is, in the fourteenth aspect, preferably configured such that the first protection circuit 6B and/or the second protection circuit 7B further includes a peak-current shut-off transistor PT1, PT2, . . . , PTn connected in series to the capacitor C1, C2, . . . , Cn.

The above configuration enables the first protection circuit and/or the second protection circuit to shut off the peak currents at the rising and falling edges of an input signal at the timing of their detection of the first overcurrent and/or second overcurrent, followed by their shutting off the input signal.

The display device 1 according to a sixteenth aspect of the present disclosure is, in any one of the third to fifth aspects, preferably configured such that the first protection circuit 6C includes a resistor 22 in which the setting value switched in response to the reception of the notification signal is input.

In this configuration, the threshold for detecting the first overcurrent and the threshold for detecting the second overcurrent are set based on a resistor's value, so that the thresholds can be changed easily.

The present disclosure is not limited to the foregoing embodiments. Various modifications can be made within the scope of the claims. An embodiment that is obtained in combination as appropriate with the technical means disclosed in the respective embodiments is also included in the technical scope of the present invention. Furthermore, combining the technical means disclosed in the respective embodiments can form a new technical feature.

While there have been described what are at present considered to be certain embodiments of the invention, it will be understood that various modifications may be made thereto, and it is intended that the appended claim cover all such modifications as fall within the true spirit and scope of the invention.

What is claimed is:

1. A display device comprising:
   a display panel including
      a pixel array including a plurality of pixels,
      a plurality of gate bus lines connected to the pixel array,
      a first gate driver circuit disposed on one side of the pixel array, and configured to supply a scan signal to the plurality of gate bus lines, and
      a second gate driver circuit disposed opposite the first gate driver circuit with respect to the pixel array, and configured to supply a scan signal to the plurality of gate bus lines;
   a first protection circuit configured to detect a first overcurrent supplied to the first gate driver circuit to protect the first gate driver circuit from the first overcurrent;
   a second protection circuit different from the first protection circuit, and configured to detect a second overcurrent supplied to the second gate driver circuit to protect the second gate driver circuit from the second overcurrent; and
   a protection-circuits connecting wire connecting the first protection circuit and the second protection circuit together, and the protection-circuits connecting wire being supplied with a notification signal for notifying detection of the first overcurrent or the second overcurrent.

2. The display device according to claim 1, wherein the first protection circuit switches a setting value in the first protection circuit in response to the reception of the notification signal.

3. The display device according to claim 2, wherein the first protection circuit switches a threshold for detecting the first overcurrent in response to the reception of the notification signal.

4. The display device according to claim 3, wherein
   the first protection circuit is configured to select, as the threshold for detecting the first overcurrent, a plurality of thresholds including a first threshold and a second threshold higher than the first threshold, and
   the first protection circuit switches the threshold for detecting the first overcurrent from the first threshold to the second threshold in response to the reception of the notification signal.

5. The display device according to claim 1, wherein upon detecting the second overcurrent, the second protection circuit shuts off the second overcurrent and supplies the notification signal to the protection-circuits connecting wire.

6. The display device according to claim 2, wherein the second protection circuit switches a setting value in the second protection circuit in response to the reception of the notification signal.

7. The display device according to claim 6, wherein
   the first protection circuit switches a threshold for detecting the first overcurrent in response to the reception of the notification signal, and
   the second protection circuit switches a threshold for detecting the second overcurrent in response to the reception of the notification signal.

8. The display device according to claim 7, wherein
   the first protection circuit is configured to select, as the threshold for detecting the first overcurrent, a plurality of thresholds including a first threshold and a second threshold higher than the first threshold,
   the first protection circuit switches the threshold for detecting the first overcurrent from the first threshold to the second threshold in response to the reception of the notification signal, the second protection circuit is configured to select, as the threshold for detecting the second overcurrent, a plurality of thresholds including a third threshold and a fourth threshold higher than the third threshold, and the second protection circuit switches the threshold for detecting the second overcurrent from the third threshold to the fourth threshold in response to the reception of the notification signal.

9. The display device according to claim 5, wherein upon detecting the first overcurrent, the first protection circuit shuts off the first overcurrent and supplies the notification signal to the protection-circuits connecting wire.

10. A display device comprising:
a display panel including
a pixel array including a plurality of pixels,
a plurality of gate bus lines connected to the pixel array,
a first gate driver circuit disposed on one side of the pixel array, and configured to supply a scan signal to the plurality of gate bus lines, and
a second gate driver circuit disposed opposite the first gate driver circuit with respect to the pixel array, and configured to supply a scan signal to the plurality of gate bus lines;
a first protection circuit configured to detect a first overcurrent supplied to the first gate driver circuit to protect the first gate driver circuit from the first overcurrent;
a second protection circuit different from the first protection circuit, and configured to detect a second overcurrent supplied to the second gate driver circuit to protect the second gate driver circuit from the second overcurrent;
a control substrate provided with a timing controller configured to control a timing for operating the first gate driver circuit and the second gate driver circuit; and
a third protection circuit disposed on the control substrate, and configured to detect the first overcurrent and the second overcurrent to protect the first gate driver circuit and the second gate driver circuit from the first overcurrent and the second overcurrent,
wherein a threshold for detecting the first overcurrent in the third protection circuit is higher than a threshold for detecting the first overcurrent in the first protection circuit, and
a threshold for detecting the second overcurrent in the third protection circuit is higher than a threshold for detecting the second overcurrent in the second protection circuit.

11. The display device according to claim 1, further comprising a source substrate connected to the display panel via a flexible circuit board provided with a source driver circuit configured to supply a video signal to a plurality of source bus lines connected to the pixel array,
wherein the first protection circuit and the second protection circuit are disposed on the source substrate.

12. The display device according to claim 1, further comprising:
a source substrate connected to the display panel via a flexible circuit board provided with a source driver circuit configured to supply a video signal to a plurality of source bus lines connected to the pixel array; and
a control substrate connected to the source substrate, and provided with a timing controller configured to control a timing for operating the first gate driver circuit, the second gate driver circuit, and the source driver circuit,
wherein the first protection circuit and the second protection circuit are disposed on the control substrate.

13. A display device comprising:
a display panel including
a pixel array including a plurality of pixels,
a plurality of gate bus lines connected to the pixel array,
a first gate driver circuit disposed on one side of the pixel array, and configured to supply a scan signal to the plurality of gate bus lines, and
a second gate driver circuit disposed opposite the first gate driver circuit with respect to the pixel array, and configured to supply a scan signal to the plurality of gate bus lines;
a first protection circuit configured to detect a first overcurrent supplied to the first gate driver circuit to protect the first gate driver circuit from the first overcurrent; and
a second protection circuit different from the first protection circuit, and configured to detect a second overcurrent supplied to the second gate driver circuit to protect the second gate driver circuit from the second overcurrent, wherein
the first protection circuit and/or the second protection circuit includes
a transistor connected to an input wire and an output wire,
a current detecting circuit connected to the transistor,
a control circuit configured to control the transistor in response to an output from the current detecting circuit, and
a capacitor connected in parallel to the transistor.

14. The display device according to claim 13, wherein the first protection circuit and/or the second protection circuit further includes a peak-current shut-off transistor connected in series to the capacitor.

15. The display device according to claim 2, wherein the first protection circuit includes a resistor in which the setting value switched in response to the reception of the notification signal is input.

* * * * *